US012601048B2

(12) United States Patent
Kato et al.

(10) Patent No.: US 12,601,048 B2
(45) Date of Patent: Apr. 14, 2026

(54) FILM FORMING METHOD AND FILM FORMING APPARATUS

(71) Applicant: Tokyo Electron Limited, Tokyo (JP)

(72) Inventors: Yoshihiro Kato, Yamanashi (JP); Junya Suzuki, Yamanashi (JP); Toshio Hasegawa, Yamanashi (JP); Kouji Shimomura, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 406 days.

(21) Appl. No.: 18/032,264

(22) PCT Filed: Oct. 8, 2021

(86) PCT No.: PCT/JP2021/037447
§ 371 (c)(1),
(2) Date: Apr. 17, 2023

(87) PCT Pub. No.: WO2022/085499
PCT Pub. Date: Apr. 28, 2022

(65) Prior Publication Data
US 2023/0399737 A1      Dec. 14, 2023

(30) Foreign Application Priority Data
Oct. 19, 2020      (JP) ................................ 2020-175461

(51) Int. Cl.
*H01L 21/02*          (2006.01)
*C23C 16/04*          (2006.01)
(Continued)

(52) U.S. Cl.
CPC ............ *C23C 16/045* (2013.01); *C23C 16/36* (2013.01); *C23C 16/45536* (2013.01); *C23C 16/505* (2013.01); *H01J 37/32174* (2013.01); *H01J 37/32449* (2013.01); *H01L 21/0214* (2013.01); *H01L 21/02274* (2013.01); *H01L 21/0228* (2013.01); *H01J 2237/332* (2013.01)

(58) Field of Classification Search
None
See application file for complete search history.

(56) References Cited

U.S. PATENT DOCUMENTS 10,431,500 B1 * 10/2019 Sirman ................ H10D 84/834
2015/0118863 A1 * 4/2015 Rathod ............ H01L 21/76826
438/778

FOREIGN PATENT DOCUMENTS

JP          2015-18879 A        1/2015
JP          2017-163078 A      9/2017
(Continued)

*Primary Examiner* — Asok K Sarkar
(74) *Attorney, Agent, or Firm* — Nath, Goldberg & Meyer; Jerald L. Meyer; Tanya E. Harkins

(57) ABSTRACT

A film forming method according to an aspect of the present disclosure is a film forming method of embedding a film in a recess formed in a surface of a substrate, and includes a first processing including (a) adsorbing a raw material gas into the recess, (b) forming a film by reacting a reaction gas with the raw material gas, and (c) activating a plasma generation gas including a hydrogen gas and a noble gas by plasma and supplying the gas into the recess to shrink the film. A plurality of cycles each including (a) and (b) are executed, and at least a part of the plurality of cycles includes (c).

20 Claims, 11 Drawing Sheets

(51) Int. Cl.
  _C23C 16/36_     (2006.01)
  _C23C 16/455_    (2006.01)
  _C23C 16/505_    (2006.01)
  _H01J 37/32_     (2006.01)

(56)          References Cited

FOREIGN PATENT DOCUMENTS

| JP | 2018-137369  A | 8/2018 |
| JP | 2020-65087   A | 4/2020 |
| JP | 2020-150206  A | 9/2020 |
| KR | 1020170055924  A | 5/2017 |
| KR | 1020170106206  A | 9/2017 |

\* cited by examiner

FIG. 2

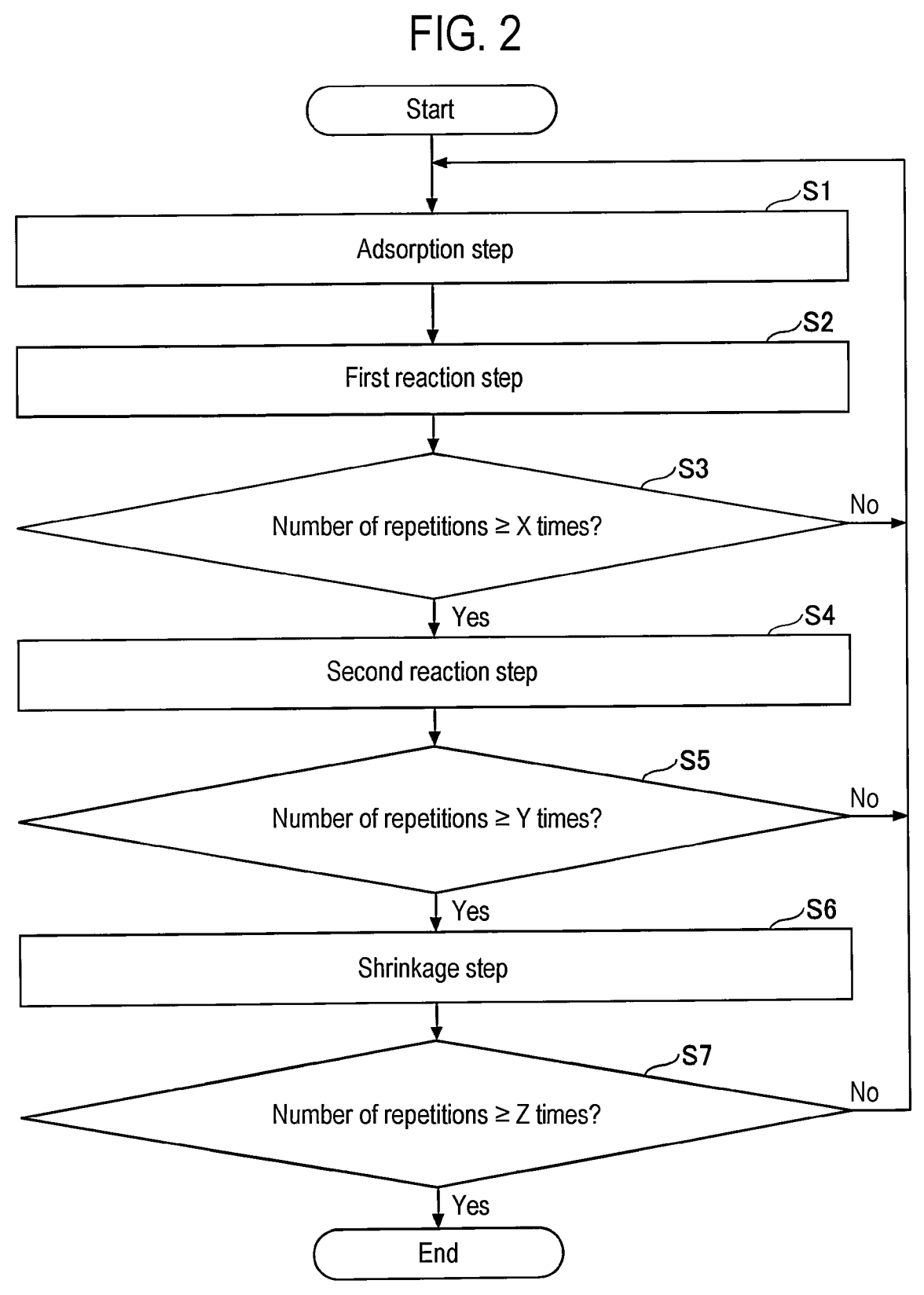

```
                    ┌──────────────┐
                    │    Start     │
                    └──────┬───────┘
                           │◄──────────────────────────┐
                           ▼                            │
                      ╭── S1                            │
    ┌──────────────────────────────────────────┐       │
    │              Adsorption step             │       │
    └──────────────────┬───────────────────────┘       │
                       ▼                                │
                      ╭── S2                            │
    ┌──────────────────────────────────────────┐       │
    │            First reaction step           │       │
    └──────────────────┬───────────────────────┘       │
                       ▼                                │
                      ╱─╲  S3                           │
                    ╱     ╲                             │
          Number of repetitions ≥ X times? ──── No ─────┤
                    ╲     ╱                             │
                      ╲─╱                               │
                       │ Yes                            │
                       ▼                                │
                      ╭── S4                            │
    ┌──────────────────────────────────────────┐       │
    │            Second reaction step          │       │
    └──────────────────┬───────────────────────┘       │
                       ▼                                │
                      ╱─╲  S5                           │
                    ╱     ╲                             │
          Number of repetitions ≥ Y times? ──── No ─────┤
                    ╲     ╱                             │
                      ╲─╱                               │
                       │ Yes                            │
                       ▼                                │
                      ╭── S6                            │
    ┌──────────────────────────────────────────┐       │
    │              Shrinkage step              │       │
    └──────────────────┬───────────────────────┘       │
                       ▼                                │
                      ╱─╲  S7                           │
                    ╱     ╲                             │
          Number of repetitions ≥ Z times? ──── No ─────┘
                    ╲     ╱
                      ╲─╱
                       │ Yes
                       ▼
                ┌──────────────┐
                │     End      │
                └──────────────┘
```

Start

S1

Adsorption step

S2

First reaction step

S3

Number of repetitions ≥ X times? — No

Yes

S4

Second reaction step

S5

Number of repetitions ≥ Y times? — No

Yes

S6

Shrinkage step

S7

Number of repetitions ≥ Z times? — No

Yes

End

201

200

201

203      200

201

203        202        200

204

203        202        200

301

300

301

303     300

301

303      300

304b      304a

304

304b
304a
304b
304a
304b
304a
304b
304a

304

303      300

FILM FORMING METHOD AND FILM FORMING APPARATUS

This is a National Phase application filed under 35 U.S.C. 371 as a national stage of PCT/JP2021/037447, filed Oct. 8, 2021, an application claiming the benefit of Japanese Application No. 2020-175461, filed Oct. 19, 2020, the content of each of which is hereby incorporated by reference in its entirety.

TECHNICAL FIELD

The present disclosure relates to a film forming method and a film forming apparatus.

BACKGROUND

In a film forming process for insulation films, metal wires, and the like in the manufacture of semiconductor devices, it is required to fill trenches having high aspect ratios without voids (gaps) due to the miniaturization of structures. Although there is an ALD method as a film forming method with good filling property, voids are likely to occur, and it is necessary to improve the filling property.

One method of improving the filling property may be to use an adsorption inhibition process (see Patent Document 1, for example). This method positively adsorbs a gas that inhibits adsorption of a precursor onto a flat portion and the vicinity of a pattern opening, thereby preventing overhang of a film at the opening and enabling embedding without voids or seams.

Another method of improving the filling property is to alternately perform film formation and etching (see Patent Document 2, for example). This method performs anisotropic etching with a high etching rate near a pattern entrance after film formation, thereby enabling embedding without voids or seams.

PRIOR ART DOCUMENTS

Patent Documents

Patent Document 1: Japanese Patent Laid-Open Publication No. 2018-137369
Patent Document 2: Japanese Patent Laid-Open Publication No. 2015-018879

SUMMARY

The present disclosure provides a technique capable of embedding and forming a film with high bottom-up performance in a recess having a high aspect ratio.

According to one aspect of the present disclosure, there is provided a film forming method of embedding a film in a recess formed in a surface of a substrate, the method including a first processing including (a) adsorbing a raw material gas into the recess, (b) forming a film by reacting a first reaction gas with the raw material gas, and (c) activating a plasma generation gas including a hydrogen gas and a noble gas by plasma and supplying the gas into the recess to shrink the film, wherein a plurality of cycles each including (a) and (b) are executed, and at least a part of the plurality of cycles includes (c).

According to the present disclosure, it is possible to embed and form a film with high bottom-up performance in a recess having a high aspect ratio.

BRIEF DESCRIPTION OF DRAWINGS

FIG. 2 is a flowchart illustrating an example of a film forming method according to an embodiment.

DETAILED DESCRIPTION

Figure 1:
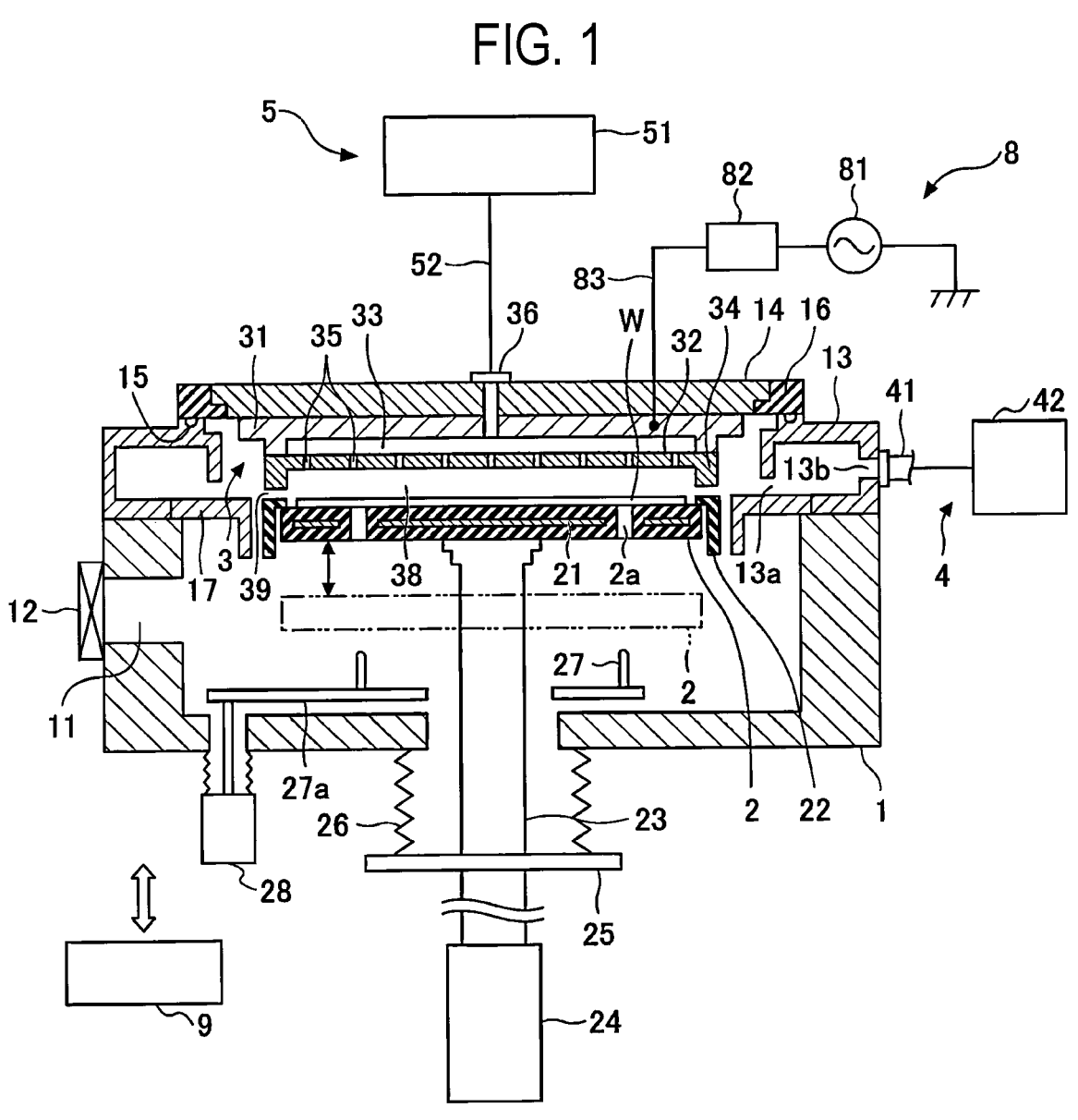
FIG. 1 is a schematic cross-sectional view illustrating an example of a film forming apparatus for carrying out a film forming method according to an embodiment.
Figure 3:
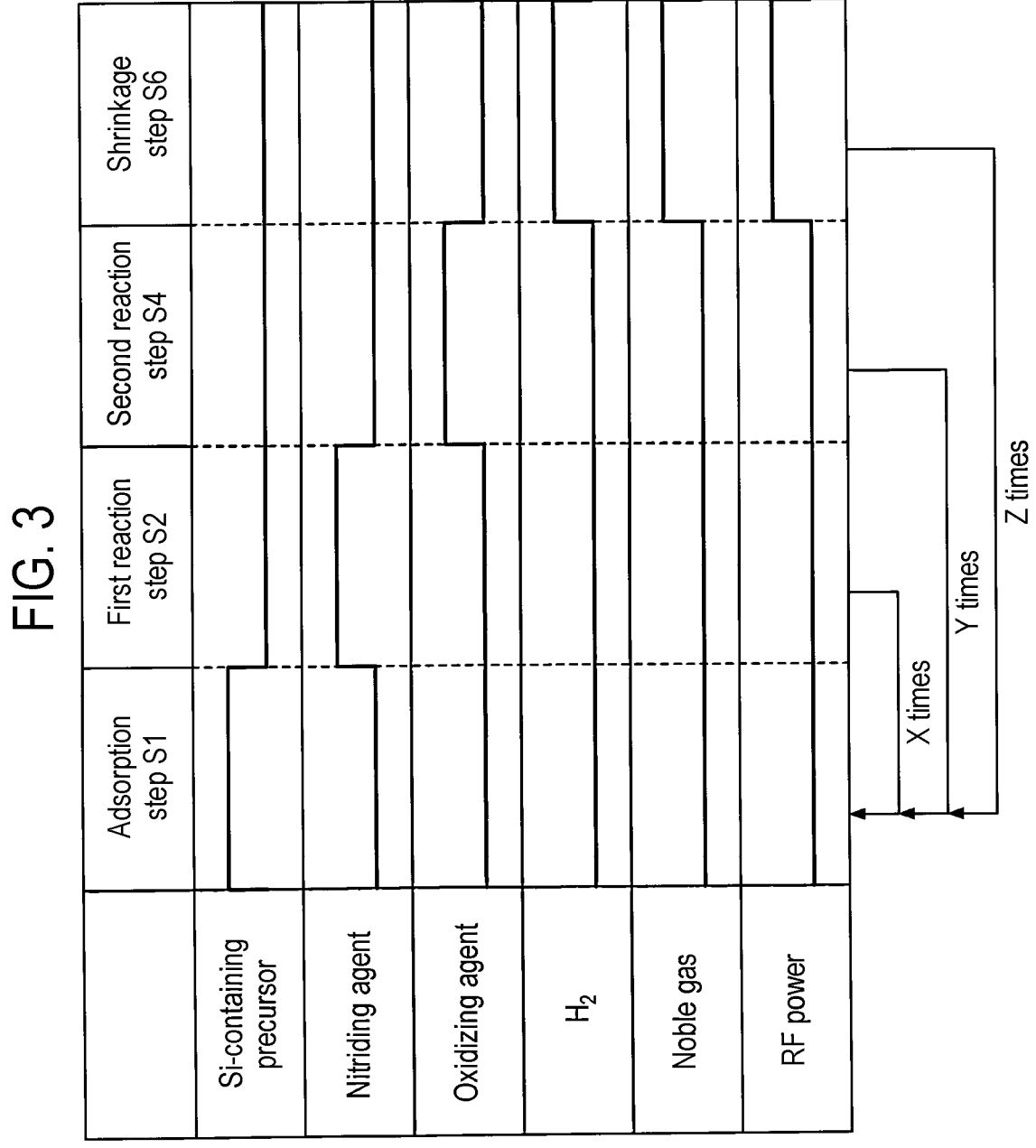
FIG. 3 is a diagram illustrating an example of a gas supply sequence in the film forming method according to an embodiment.
Figure 4:
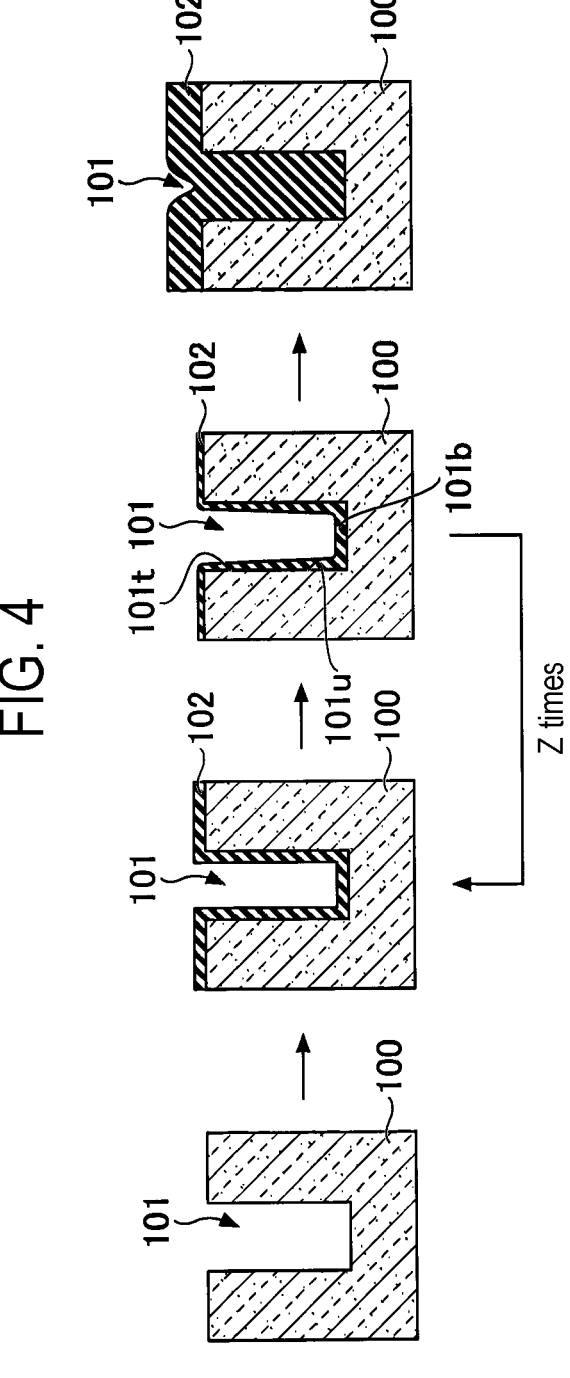
FIG. 4 is a cross-sectional view of a process illustrating an example of the film forming method according to an embodiment.

Hereinafter, non-limiting exemplary embodiments of the present disclosure will be described with reference to the accompanying drawings. In all the accompanying drawings, the same or corresponding members or components will be denoted by the same or corresponding reference numerals, and redundant descriptions thereof will be omitted.

(Film Forming Apparatus)

An example of a film forming apparatus for carrying out a film forming method according to an embodiment will be described with reference to FIG. 1. The film forming apparatus includes a processing container 1, a stage 2, a shower head 3, an exhauster 4, a gas supplier 5, an RF power supplier 8, a controller 9, and the like.

The processing container 1 is formed of a metal such as aluminum and has a substantially cylindrical shape. The processing container 1 accommodates a wafer W therein. A loading/unloading port 11 for loading or unloading the wafer W is formed in a sidewall of the processing container 1. The loading/unloading port 11 is opened and closed by a gate valve 12. An annular exhaust duct 13 having a rectangular cross section is provided on a main body of the processing container 1. A slit 13*a* is formed in the exhaust duct 13 along an inner peripheral surface thereof. An exhaust port 13*b* is formed in an outer wall of the exhaust duct 13. A ceiling wall 14 is provided on an upper surface of the exhaust duct 13 so as to close a top opening of the processing container 1 with an insulating member 16 interposed therebetween. A space between the exhaust duct 13 and the insulating member 16 is airtightly sealed with a seal ring 15. A partition member 17 vertically divides the interior of the processing container 1 when the stage 2 (and a cover member 22) are raised to a processing position to be described later.

The stage 2 horizontally supports the wafer W inside the processing container 1. The stage 2 is formed in the shape of a disk having a size corresponding to the wafer W, and is supported by a support member 23. The stage 2 is formed of a ceramic material such as AlN, or a metal material such as an aluminum or nickel alloy, and has a heater 21 embedded therein for heating the wafer W. The heater 21 generates heat upon receiving power from a heater power supply (not illustrated). Then, the wafer W is controlled to a predetermined temperature by controlling the output of the heater 21 in response to a temperature signal of a thermocouple (not illustrated) provided near an upper surface of the stage 2. The cover member 22 formed of ceramics such as alumina is provided around the stage 2 so as to cover an outer peripheral region of the upper surface and a side surface of the stage 2.

The support member 23 is provided on a bottom surface of the stage 2 to support the stage 2. The support member 23 passes through a hole formed in a bottom wall of the processing container 1 from the center of the bottom surface of the stage 2 to extend downward of the processing container 1, and is connected at a lower end thereof to a lifting mechanism 24. The lifting mechanism 24 lifts the stage 2 via the support member 23 between the processing position illustrated in FIG. 1 and a transfer position thereunder at which transfer of the wafer W is possible as indicated by the two-dot dashed line. A flange 25 is attached to the support member 23 at a position below the processing container 1. A bellows 26 is provided between a bottom surface of the processing container 1 and the flange 25. The bellows 26 separates the atmosphere inside the processing container 1 from outside air and is adapted to expand and contract according to a lifting operation of the stage 2.

Three (only two of which are illustrated) wafer support pins 27 are provided near the bottom surface of the processing container 1 so as to protrude upward from a lifting plate 27*a*. The wafer support pins 27 are lifted by a lifting mechanism 28 provided below the processing container 1 via the lifting plate 27*a*. The wafer support pins 27 are inserted into through-holes 2*a* provided in the stage 2 which is at the transfer position and are capable of protruding and retracting to and from the upper surface of the stage 2. The wafer W is transferred between a transfer mechanism (not illustrated) and the stage 2 by lifting the wafer support pins 27.

The shower head 3 supplies a processing gas in the form of a shower into the processing container 1. The shower head 3 is formed of a metal, is provided so as to face the stage 2, and has approximately the same diameter as the stage 2. The shower head 3 includes a main body 31 and a shower plate 32. The main body 31 is fixed to the ceiling wall 14 of the processing container 1. The shower plate 32 is connected to the underside of the main body 31. A gas diffusion space 33 is defined between the main body 31 and the shower plate 32. A gas introduction hole 36 is provided in the gas diffusion space 33 so as to penetrate the center of the ceiling wall 14 of the processing container 1 and the main body 31. An annular protrusion 34 is formed on a peripheral edge portion of the shower plate 32 to protrude downward. A gas discharge hole 35 is formed in an inner flat portion of the annular protrusion 34. In a state where the stage 2 is present at the processing position, a processing space 38 is created between the stage 2 and the shower plate 32, and an upper surface of the cover member 22 and the annular protrusion 34 are close to each other to create an annular gap 39.

The exhauster 4 exhausts the interior of the processing container 1. The exhauster 4 includes an exhaust pipe 41 connected to the exhaust port 13*b* and an exhaust mechanism 42 having a vacuum pump, a pressure control valve, and the like connected to the exhaust pipe 41. During a processing, the gas inside the processing container 1 reaches the exhaust duct 13 through the slit 13*a*, and is exhausted from the exhaust duct 13 through the exhaust pipe 41 by the exhaust mechanism 42.

The gas supplier 5 supplies various processing gases to the shower head 3. The gas supplier 5 includes a gas source 51 and a gas line 52. The gas source 51 includes, for example, a source for various processing gases, a mass flow controller, and a valve (none of which are illustrated). The various processing gases include a Si-containing precursor, a nitriding agent, an oxidizing agent, and a purge gas, which are used in a film forming method of an embodiment to be described later. These various gases are introduced into the gas diffusion space 33 from the gas source 51 via the gas line 52 and the gas introduction hole 36.

Further, the film forming apparatus is a capacitively coupled plasma apparatus, the stage 2 functions as a lower electrode, and the shower head 3 functions as an upper electrode. The stage 2 is grounded via a condenser (not illustrated). However, for example, the stage 2 may be grounded without a condenser, or may be grounded via a circuit in which a condenser and a coil are combined. The shower head 3 is connected to the RF power supplier 8.

The RF power supplier 8 supplies radio frequency power (hereinafter also referred to as "RF power") to the shower head 3. The RF power supplier 8 includes an RF power supply 81, a matcher 82, and a feed line 83. The RF power supplier 81 is a power supply that generates RF power. The RF power has a frequency suitable for plasma generation. A frequency of the RF power is, for example, within a range from 450 KHz in the low frequency band to 2.45 GHz in the microwave band. The RF power supplier 81 is connected to the main body 31 of the shower head 3 via the matcher 82 and the feed line 83. The matcher 82 has a circuit for matching the load impedance to the internal impedance of the RF power supplier 81. In addition, the RF power supplier 8 has been described as supplying the RF power to the shower head 3 serving as the upper electrode, but is not limited thereto. It may be configured to supply the RF power to the stage 2 serving as the lower electrode.

The controller 9 is, for example, a computer, and includes a central processing unit (CPU), a random access memory (RAM), a read only memory (ROM), an auxiliary storage device, and the like. The CPU operates based on a program stored in the ROM or the auxiliary storage device, and controls an operation of the film forming apparatus. The controller 9 may be provided inside or outside the film forming apparatus. When the controller 9 is provided outside the film forming apparatus, the controller 9 may control the film forming apparatus by, for example, a wired or wireless communication device.

(Film Forming Method)

An example of a film forming method of an embodiment will be described with reference to FIGS. 1 to 4. In the following, a case where a silicon oxycarbonitride film (SiOCN film) is embedded in a recess formed in a surface of a substrate by the above-described film forming apparatus will be described by way of example.

First, the controller 9 loads a substrate 100 having a recess 101 formed in a surface thereof into the processing container 1. The substrate 100 is, for example, a semiconductor wafer such as a silicon wafer. The recess 101 is, for example, a trench or a hole. The controller 9 controls the lifting mechanism 24 to lower the stage 2 to the transfer position, and in this state, opens the gate valve 12. Subsequently, the substrate 100 is loaded into the processing container 1 through the loading/unloading port 11 by a transfer arm (not illustrated), and is placed on the stage 2 heated to a predetermined temperature by the heater 21. Subsequently, the controller 9 controls the lifting mechanism 24 to raise the stage 2 up to the processing position, and reduces the internal pressure of the processing container 1 to a predetermined degree of vacuum by the exhaust mechanism 42.

Subsequently, the controller 9 executes adsorption step S1. In the adsorption step S1, a Si-containing precursor is supplied into the processing container 1 via the shower head 3 from the gas supplier 5. Thus, the Si-containing precursor is adsorbed into the recess 101 to form an adsorption layer of the Si-containing precursor in the recess 101. The Si-containing precursor may be, for example, a precursor containing silicon (Si), carbon (C), and halogen such as 1,1,3,3-tetrachloro-1,3-disilacyclobutane $(C_2H_4Cl_4Si_2)$. After the adsorption step S1, a purge step of exhausting the Si-containing precursor and the like remaining in the processing container 1 may be executed.

Subsequently, the controller 9 executes first reaction step S2. In the first reaction step S2, a nitriding agent is supplied into the processing container 1 via the shower head 3 from the gas supplier 5. Thus, the nitriding agent reacts with the Si-containing precursor, and the adsorption layer formed in the recess 101 is nitrided. The nitriding agent may be, for example, ammonia $(NH_3)$. After the first reaction step S2, a purge step of exhausting the nitriding agent and the like remaining in the processing container 1 may be executed.

Subsequently, the controller 9 determines whether or not the number of repetitions of a cycle including the adsorption step S1 and the first reaction step S2 is equal to or greater than X times (X is a natural number) (first determination step S3). When the number of repetitions of the cycle is equal to or greater than X times, the controller 9 proceeds the processing to second reaction step S4. On the other hand, when the number of repetitions of the cycle is less than X times, the controller 9 returns the processing to the adsorption step S1. In this way, the controller 9 repeats the cycle including the adsorption step S1 and the first reaction step S2 until the number of repetitions of the cycle reaches X times. Thereby, a SiCN film having a predetermined film thickness is formed in the recess 101.

Subsequently, the controller 9 executes the second reaction step S4. In the second reaction step S4, an oxidizing agent is supplied into the processing container 1 via the shower head 3 from the gas supplier 5. Thus, the oxidizing agent reacts with the Si-containing precursor, and the adsorption layer formed in the recess 101 is oxidized. The oxidizing agent may be, for example, oxygen $(O_2)$, ozone $(O_3)$, water vapor $(H_2O)$, hydrogen peroxide $(H_2O_2)$, or isopropyl alcohol (IPA). After the second reaction step S4, a purge step of exhausting the oxidizing agent and the like remaining in the processing container 1 may be executed.

Subsequently, the controller 9 determines whether or not the number of repetitions of a cycle including the adsorption step S1, the first reaction step S2, the first determination step S3, and the second reaction step S4 is equal to or greater than Y times (Y is a natural number) (second determination step S5). When the number of repetitions of the cycle is equal to or greater than Y times, the controller 9 proceeds the processing to shrinkage step S6. On the other hand, when the number of repetitions of the cycle is less than Y times, the controller 9 returns the processing to the adsorption step S1. In this way, the controller 9 repeats the cycle including the adsorption step S1, the first reaction step S2, the first determination step S3, and the second reaction step S4 until the number of repetitions of the cycle reaches Y times. Thereby, a SiOCN film 102 having a predetermined film thickness is formed in the recess 101.

Subsequently, the controller 9 executes the shrinkage step S6. In the shrinkage step S6, a plasma generation gas including hydrogen $(H_2)$ and a noble gas is supplied into the processing container 1 via the shower head 3 from the gas supplier 5, and RF power is supplied to the shower head 3 from the RF power supplier 8, thereby generating plasma in the processing space 38. Thus, the SiOCN film 102 formed in the recess 101 is modified. At this time, ions or radicals included in the plasma cut, for example, terminal groups such as a $CH_3$ group, a $NH_2$ group, and an OH group in the SiOCN film 102, or removes H from $CH_x$, $NH_x$, and OH. Thus, dangling bonds are generated on a surface of the SiOCN film 102, and the dangling bonds newly form bonds such as Si—C—Si, Si—N—Si, and Si—O—Si. Therefore, the SiOCN film 102 shrinks. Since the ions included in the plasma are less likely to reach a bottom 101b of the recess 101, it is easy for the SiOCN film 102 to shrink in an upper portion 101t of the recess 101, but the SiOCN film 102 hardly shrinks in a lower portion 101u of the recess 101. Therefore, the lower portion 101u of the recess 101 exhibits a higher film formation speed (film formation rate) For example, any one of helium (He), neon (Ne), argon (Ar), krypton (Kr), and xenon (Xe), or a mixed gas of two or more of these may be used as the noble gas. After the reforming step S6, a purge step of exhausting the plasma generation gas and the like remaining in the processing container 1 may be executed.

Subsequently, the controller 9 determines whether or not the number of repetitions of a cycle including the adsorption step S1, the first reaction step S2, the first determination step S3, the second reaction step S4, the second determination step S5, and the shrinkage step S6 is equal to or greater than Z times (Z is a natural number) (third determination step S7). When the number of repetitions of the cycle is equal to or greater than Z times, the controller 9 ends the processing. On the other hand, when the number of repetitions of the cycle is less than Z times, the controller 9 returns the processing to the adsorption step S1. In this way, the controller 9 repeats the cycle including the adsorption step S1, the first reaction step S2, the first determination step S3, the second reaction step S4, the second determination step S5, and the shrinkage step S6 until the number of repetitions of the cycle reaches Z times. Thus, the SiOCN film 102 is embedded in a V-shape inside the recess 101. That is, the SiOCN film 102 with high bottom-up performance can be embedded and formed in the recess 101. As a result, the SiOCN film 102 can be embedded in the recess 101 without voids or seams.

According to the film forming method of the embodiment described above, a plurality of cycles each including the adsorption step S1, the first reaction step S2, the first determination step S3, and the second reaction step S4 are executed, and at least a part of the plurality of cycles includes the shrinkage step S6. Thus, the SiOCN film 102 formed on the upper portion 101*t* of the recess 101 is selectively shrunk with respect to the lower portion 101*u* of the recess 101, thus exhibiting a low film formation rate. As a result, the SiOCN film 102 can be embedded in a V-shape inside the recess 101. That is, the SiOCN film 102 can be embedded with high bottom-up performance.

Further, according to the film forming method of the embodiment, the amount of shrinkage of the SiOCN film 102 can be adjusted by controlling the influence of plasma on the SiOCN film 102 in the shrinkage step S6. For example, the amount of shrinkage of the SiOCN film 102 can be reduced as the influence of plasma on the SiOCN film 102 in the shrinkage step S6 is reduced. The influence of plasma includes, for example, frequency, RF power, and time. The frequency is an index indicating how many times the cycle including the adsorption step S1, the first reaction step S2, the first determination step S3, and the second reaction step S4 is repeated before the shrinkage step S6 is performed. The RF power is the RF power supplied from the RF power supplier 8 to the shower head 3 in the shrinkage step S6. The time is the time during which the RF power is supplied from the RF power supplier 8 to the shower head 3 in the shrinkage step S6.

For example, when embedding the SiOCN film 102 in the recess 101 having a high aspect ratio, the influence of plasma on the SiOCN film 102 is preferably increased in the initial stage of embedding. This enables embedding with high bottom-up performance in the recess 101 having a high aspect ratio. Specifically, it is preferable to increase the frequency, to increase the RF power, to lengthen the time, or two or more of these may be combined. Then, the influence of plasma on the SiOCN film 102 is preferably gradually reduced as the embedding progresses to the later stage. Thus, since the amount of shrinkage of the SiOCN film 102 is reduced in the shrinkage step S6, the film formation rate is increased and the throughput is improved. Specifically, it is preferable to gradually reduce the frequency, to gradually reduce the RF power, to shorten the time, or two or more of these may be combined. In addition, since the lower portion 101*u* of the recess 101 is already filled in the later stage of embedding, voids or seams are less likely to occur even if the amount of shrinkage of the SiOCN film 102 is reduced. Further, the shrinkage step S6 may not be performed in the later stage of embedding.

In addition, in the film forming method of the above embodiment, a case where the first reaction step S2 is a step of nitriding the adsorption layer and the second reaction step S4 is a step of oxidizing the adsorption layer has been described, but the present disclosure is not limited thereto. For example, the first reaction step S2 may be a step of oxidizing the adsorption layer, and the second reaction step S4 may be a step of nitriding the adsorption layer.

Further, in the film forming method of the above embodiment, a case where the adsorption step S1 and the first reaction step S2 are repeated in this order has been described, but the present disclosure is not limited thereto. For example, the order of the adsorption step S1 and the first reaction step S2 may be exchanged. That is, the first reaction step S2 and the adsorption step S1 may be repeated in this order. In this case, after the first determination step S3, the first reaction step S2 may be performed, and then, the second reaction step S4 may be performed.

Further, in the film forming method of the above embodiment, the SiOCN film 102 has been described as a film embedded in the recess 101, but the present disclosure is not limited thereto. For example, the film embedded in the recess 101 may be a $SiO_2$ film, a SiN film, a SiC film, a SiOC film, a SiON film, a SiCN film, a TiN film, a TaN film, a $Ta_2O_5$ film, a HfO film, or a ZrO film. When embedding these films in the recess 101, the second reaction step S4 and the second determination step S5 of the above embodiment may be omitted.

Further, the intensity of a plasma processing is preferably increased or the time of the plasma processing is preferably lengthened in order to prevent the occurrence of voids or seams when embedding and forming a film in a recess having a high aspect ratio. However, increasing the intensity of the plasma processing or lengthening the time of the plasma processing may cause a damage to a base film (especially a low-k film) forming the recess. Therefore, after forming a film (hereinafter referred to as "liner film") for the purpose of protecting the base film in advance in the recess, the SiOCN film may be embedded in the recess by the film forming method of the above-described embodiment. The liner film may be, for example, a SiN film, a $SiO_2$ film, a SiC film, a SiCN film, a SiON film, or a SiOCN film.

Further, a film that has a low dielectric constant and high ashing resistance or high etching resistance may be required as a film embedded in the recess. However, it is difficult to obtain sufficient resistance from a film having a relatively low dielectric constant, and a highly resistant film has a high dielectric constant. Therefore, it is preferable that, after embedding a film in the recess under the condition that the dielectric constant is lowered in the film forming method of the above-described embodiment, the embedded film is covered with a film having high ashing resistance or high etching resistance (hereinafter referred to as "cap film"). Thus, the entire film embedded in the recess achieves a low dielectric constant and high ashing resistance or high etching resistance. The cap film may be, for example, a SiC film or a SiCN film.

Figure 5A:
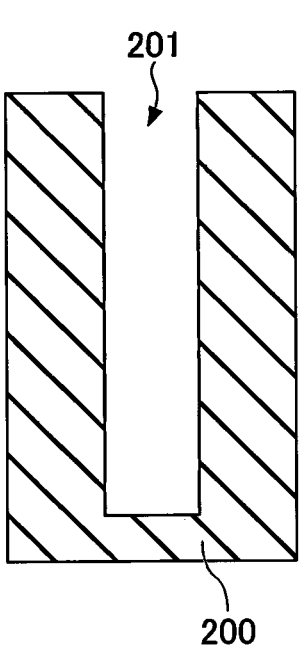
FIG. 5A is a cross-sectional view of a process illustrating an example of the film forming method in which a liner film, a SiOCN film, and a cap film are formed in this order.
Figure 5B:
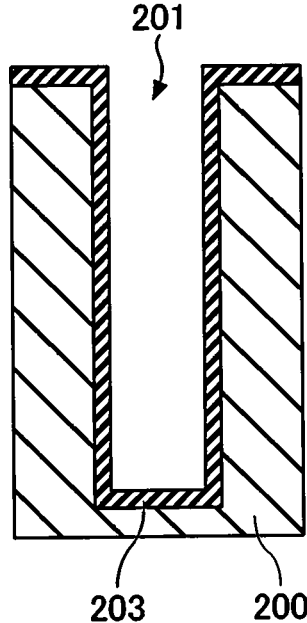
FIG. 5B is a cross-sectional view of a process illustrating the example of the film forming method in which the liner film, the SiOCN film, and the cap film are formed in this order.
Figure 5C:
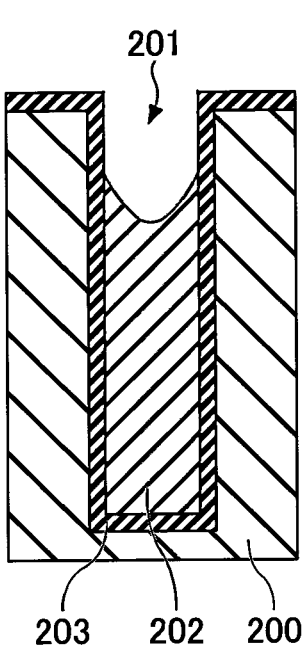
FIG. 5C is a cross-sectional view of a process illustrating the example of the film forming method in which the liner film, the SiOCN film, and the cap film are formed in this order.
Figure 5D:
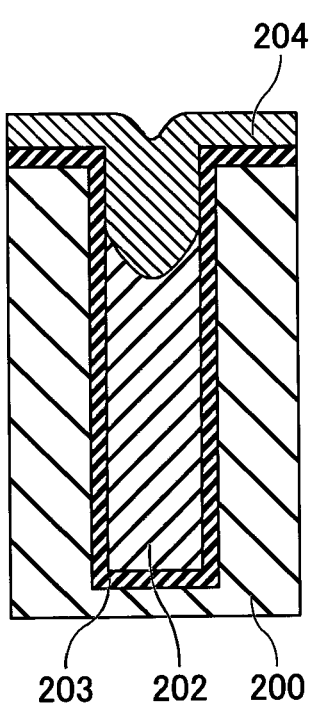
FIG. 5D is a cross-sectional view of a process illustrating the example of the film forming method in which the liner film, the SiOCN film, and the cap film are formed in this order.

FIGS. 5A to 5D are cross-sectional views of the processes illustrating an example of the film forming method in which a liner film, a SiOCN film, and a cap film are formed in this order. First, as illustrated in FIG. 5A, a base film 200 such as a low-k film forming a recess 201 is prepared. Next, as illustrated in FIG. 5B, a liner film 203 is formed, for example, conformally in the recess 201. Next, as illustrated in FIG. 5C, a SiOCN film 202 is embedded in the recess 201 with the liner film 203 formed thereon by the film forming method of the above-described embodiment, for example, to such an extent that the recess 201 is not completely filled. Next, as illustrated in FIG. 5D, a cap film 204 is formed in the recess 201 filled with the SiOCN film 202 to completely fill the recess 201.

Further, the recess may be filled with a film (hereinafter referred to as "laminate film") in which a first film having a relatively low dielectric constant and a second film having high ashing resistance or high etching resistance are alternately laminated. The first film may be, for example, a $SiO_2$ film, a SiOC film, a SiON film, or a SiOCN film. The second film may be, for example, a SiC film or a SiCN film. At this time, when the first film is formed by the film forming method of the above-described embodiment, the film having high ashing resistance or high etching resistance may be a conformal film. The film thickness ratio between the first film and the second film may, for example, be constant or vary during the formation of the laminate film. For example, when embedding a film in a recess having a high aspect ratio, the ratio of the first film to the second film is preferably increased in the initial stage. Thus, since the film is formed with high bottom-up performance near the bottom of the recess, the occurrence of voids in the recess may be prevented. Further, the ratio of the second film to the first film is preferably increased as the embedding progresses. Thus, the second film having high ashing resistance or high etching resistance is mainly formed on the surface (opening) side of the recess, which results in increased ashing resistance or etching resistance. When increasing the ratio of the second film to the first film, the ratio of the second film to the first film may vary stepwise (in a stepped manner) or continuously (in a gradient manner).

Figures 6A, 6B:
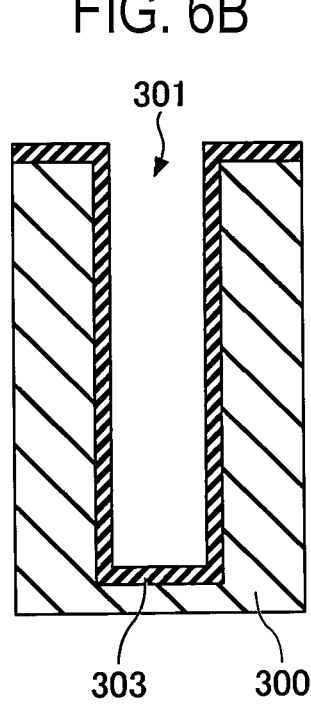
FIG. 6A is a cross-sectional view of a process illustrating an example of the film forming method in which a liner film and a laminate film are formed in this order.
FIG. 6B is a cross-sectional view of a process illustrating the example of the film forming method in which the liner film and the laminate film are formed in this order.
Figures 6C, 6D:
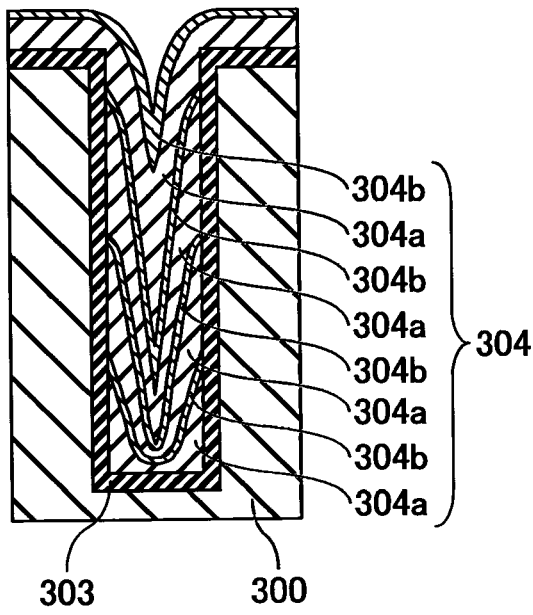
FIG. 6C is a cross-sectional view of a process illustrating the example of the film forming method in which the liner film and the laminate film are formed in this order.
FIG. 6D is a cross-sectional view of a process illustrating the example of the film forming method in which the liner film and the laminate film are formed in this order.

FIGS. 6A to 6D are cross-sectional views of the processes illustrating an example of the film forming method in which a liner film and a laminate film are formed in this order. First, as illustrated in FIG. 6A, a base film 300 such as a low-k film forming a recess 301 is prepared. Next, as illustrated in FIG. 6B, a liner film 303 is formed, for example, conformally in the recess 301. Next, as illustrated in FIG. 6C, a laminate film 304 is formed in the recess 301 with the liner film 303 formed therein by alternately forming a first film 304*a* and a second film 304*b*, and as illustrated in FIG. 6D, the interior of the recess 301 is completely filled with the laminate film 304.

EXAMPLE

An example carried out to confirm the effects of the film forming method of the embodiment will be described with reference to FIG. 7. In the example, a SiOCN film was formed in a recess by changing the frequency of performing the shrinkage step S6 in the film forming method of the embodiment. More specifically, the SiOCN film was formed in the recess by repeating a cycle of repeating the alternate supply of the Si-containing precursor and the nitriding agent X times, and then repeating the supply of the oxidizing agent Y times, followed by a $H_2$ plasma processing until reaching a desired film thickness. Further, for comparison, a SiOCN film was formed in a recess under the same condition as in the example except that the shrinkage step S6 was not performed. Further, the coverage of the SiOCN film to the recess was evaluated for each of the formed SiOCN films. In addition, in the example, a trench was used as the recess, and tetrachlorodisilacyclobutane ($C_2H_4Cl_4Si_2$) was used as the Si-containing precursor, $NH_3$ was used as the nitriding agent, and $H_2O$ was used as the oxidizing agent.

Figure 7:
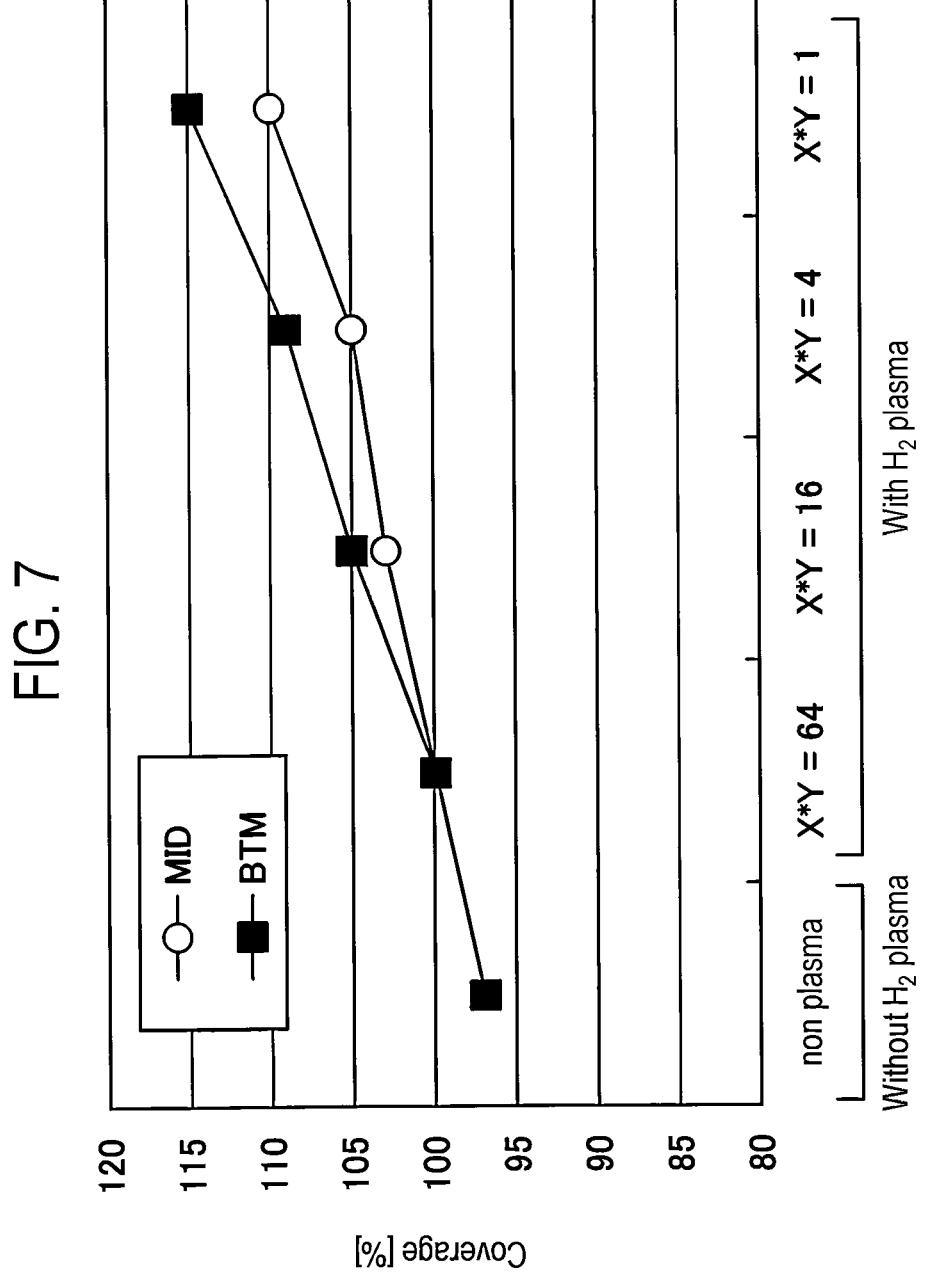
FIG. 7 is a diagram illustrating result of evaluating coverage when the frequency of performing a shrinkage process is changed.
Figure 8:
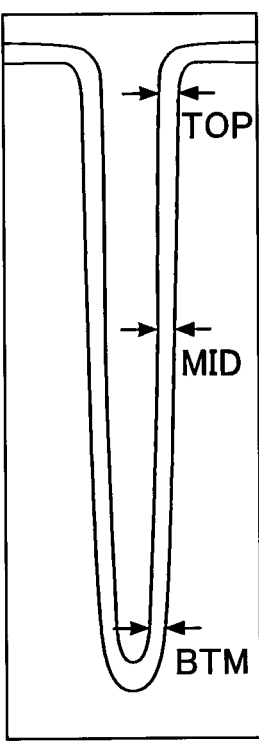
FIG. 8 is a diagram for illustrating a method of evaluating the coverage of FIG. 7.

FIG. 7 is a diagram illustrating the result of evaluating coverage when the frequency of performing the shrinkage step S6 is changed. In FIG. 7, the horizontal axis represents the frequency of performing the shrinkage step S6, and the vertical axis represents the coverage of the SiOCN film to the recess. In FIG. 7, the frequency of the shrinkage step S6 is represented by an index indicating how many X*Y cycles were performed before the shrinkage step S6 was performed. Specifically, "X*Y=64", "X*Y=16", "X*Y=4", and "X*Y=1" represent results when a cycle of performing the shrinkage step S6 after the value of X*Y reaches 64 times, 16 times, 4 times, and 1 time, respectively, was repeated until reaching a desired film thickness. Further, in FIG. 7, the ratio of the film thickness on a middle portion side surface MID and a lower portion side surface BTM to the film thickness of an upper portion side surface TOP in the trench T as illustrated in FIG. 8 is represented as the coverage [%] of the SiOCN film to the recess.

As illustrated in FIG. 7, when the shrinkage step S6 was not performed (see "non plasma" in FIG. 7), the coverage of the MID and the BTM is less than 100%. That is, the film thickness of the MID and the BTM is smaller than the film thickness of the TOP. On the other hand, when the shrinkage step S6 was performed and the value of X*Y is set to 64, the coverage of the MID and the BTM is about 100%. From this result, it can be seen that a film may be conformally formed in the trench T by setting the value of X*Y to 64. Further, when the shrinkage step S6 was performed, the smaller the value of X*Y, the greater the coverage of the MID and the BTM. From this result, it can be seen that film formation with high bottom-up performance (V-shaped film formation) in which the film thicknesses of the MID and the BTM is greater than the film thickness of the TOP is possible by increasing the frequency of performing the shrinkage step S6.

Thus, it was revealed from the result of FIG. 7 that the SiOCN film may be formed in the trench with high bottom-up performance when the film formation of the SiOCN film in the recess is performed while changing the frequency of performing the shrinkage step S6. Further, it was revealed that embedding properties may be adjusted by controlling the frequency of performing the shrinkage step S6.

Figure 9:
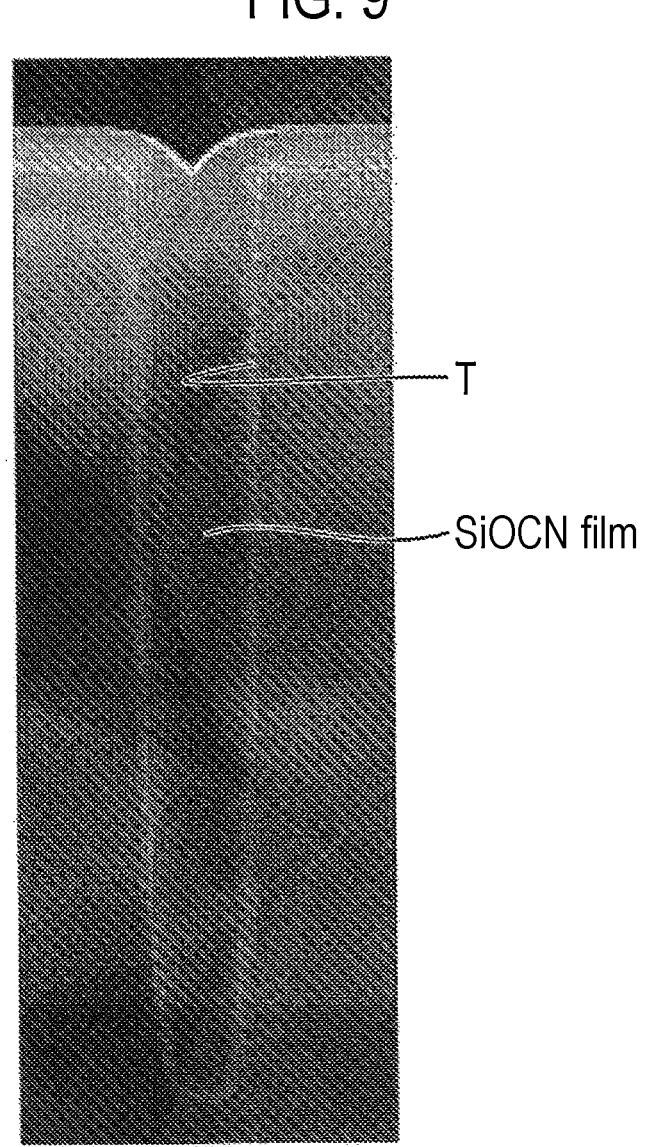
FIG. 9 is a diagram illustrating the result of carrying out the film forming method of the embodiment.

FIG. 9 is a diagram illustrating the result of performing the film forming method of the embodiment, and is a SEM image illustrating a cross section of the SiOCN film embedded in the trench T when the value of X*Y is 1. The ratio of the height to the width of the trench T (aspect ratio) is about 7. As illustrated in FIG. 9, it can be seen that the SiOCN film is embedded in the trench T without voids or seams. It was revealed from the result of FIG. 9 that even when the aspect ratio of the trench T is high, the SiOCN film may be formed in the trench T without voids or seams by increasing the frequency of performing the shrinkage step S6.

In addition, in the above embodiment, the Si-containing precursor is an example of a raw material gas, the nitriding agent is an example of a first reaction gas, and the oxidizing agent is an example of a second reaction gas.

The embodiments disclosed herein should be considered to be exemplary and not limitative in all respects. The above embodiments may be omitted, replaced or modified in various embodiments without departing from the scope of the appended claims and their gist.

This international application claims priority to Japanese Patent Application No. 2020-175461 filed on Oct. 19, 2020, which is incorporated herein by reference in its entirety.

EXPLANATION OF REFERENCE NUMERALS

S1: adsorption step, S2: first reaction step, S4: second reaction step, S6: shrinkage step

What is claimed is:

1. A film forming method of embedding a film in a recess formed in a surface of a substrate, the method comprising:
a first processing comprising:
  (a) adsorbing a raw material gas into the recess;
  (b) forming the film by reacting a first reaction gas with the raw material gas; and
  (c) activating a plasma generation gas including a hydrogen gas and a noble gas by plasma and supplying the plasma generation gas into the recess to shrink the film,
  wherein a plurality of cycles each including (a) and (b) are executed, and at least a part of the plurality of cycles includes (c).

2. The film forming method of claim 1, wherein the raw material gas includes at least one selected from a group including silicon (Si) and a metal, and wherein the first reaction gas includes at least one selected from a group including oxygen (O), nitrogen (N), and carbon (C).

3. The film forming method of claim 1, further comprising (d) forming a film by reacting a second reaction gas with the raw material gas, the second reaction gas being different from the first reaction gas, wherein a plurality of cycles each including (a), (b), and (d) are executed, and at least a part of the plurality of cycles includes (c).

4. The film forming method of claim 1, wherein the recess is a trench or a hole.

5. The film forming method of claim 1, comprising (e) forming a liner film in the recess, (e) being performed before the first processing.

6. The film forming method of claim 1, comprising a second processing of forming a film covering the film formed in the first processing after the first processing, the film of the second processing having higher ashing resistance and higher etching resistance than the film of the first processing.

7. The film forming method of claim 1, wherein an influence of the plasma on the film is gradually reduced.

8. The film forming method of claim 7, wherein the influence of the plasma includes power for generating the plasma in (c).

9. The film forming method of claim 7, wherein the influence of the plasma includes a time during which the plasma is generated in (c).

10. The film forming method of claim 7, wherein the influence of the plasma includes a frequency of (c) included in the plurality of cycles.

11. The film forming method of claim 10, wherein the influence of the plasma includes power for generating the plasma in (c).

12. The film forming method of claim 11, wherein the influence of the plasma includes a time during which the plasma is generated in (c).

13. The film forming method of claim 12, wherein the raw material gas includes at least one selected from a group including silicon (Si) and a metal, and wherein the first reaction gas includes at least one selected from a group including oxygen (O), nitrogen (N), and carbon (C).

14. The film forming method of claim 13, further comprising (d) forming a film by reacting a second reaction gas with the raw material gas, the second reaction gas being different from the first reaction gas, wherein a plurality of cycles each including (a), (b), and (d) are executed, and at least a part of the plurality of cycles includes (c).

15. The film forming method of claim 14, wherein the raw material gas includes at least one selected from a group including silicon (Si) and a metal, wherein the first reaction gas includes at least one selected from a group including oxygen (O), nitrogen (N), and carbon (C), and wherein the second reaction gas includes an element different from the first reaction gas among oxygen (O), nitrogen (N), and carbon (C).

16. The film forming method of claim 15, wherein the recess is a trench or a hole.

17. The film forming method of claim 16, comprising (e) forming a liner film in the recess, (e) being performed before the first processing.

18. The film forming method of claim 17, comprising alternately repeating the first processing and a third processing of forming a film having higher ashing resistance and higher etching resistance than the film formed in the first processing.

19. The film forming method of claim 17, comprising a second processing of forming a film covering the film formed in the first processing after the first processing, the film of the second processing having higher ashing resistance and higher etching resistance than the film of the first processing.

20. A film forming apparatus comprising:

a processing container configured to accommodate a substrate having a recess formed in a surface thereof;

a gas supplier configured to supply a raw material gas, a reaction gas, and a plasma generation gas into the processing container;

an RF power supplier configured to generate plasma; and a controller, wherein the plasma generation gas includes a hydrogen gas and a noble gas, and wherein the controller is configured to control the gas supplier and the RF power supplier so as to execute:

(a) adsorbing the raw material gas into the recess;

(b) forming a film by reacting the reaction gas with the raw material gas; and (c) activating the plasma generation gas by plasma and supplying the plasma generation gas into the recess to shrink the film, and wherein the controller is configured to control the gas supplier and the RF power supplier so that a plurality of cycles each including (a) and (b) are executed and at least a part of the plurality of cycles includes (c).

* * * * *